United States Patent
Kwon et al.

(10) Patent No.: US 8,604,463 B2
(45) Date of Patent: Dec. 10, 2013

(54) ORGANIC LIGHT EMITTING DIODE DISPLAY AND METHOD OF MANUFACTURING THE SAME

(75) Inventors: Do-Hyun Kwon, Yongin (KR); Il-Jeong Lee, Yongin (KR); Choong-Youl Im, Yongin (KR); Ju-Won Yoon, Yongin (KR); Jong-Mo Yeo, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 240 days.

(21) Appl. No.: 12/900,789

(22) Filed: Oct. 8, 2010

(65) Prior Publication Data
US 2011/0084257 A1 Apr. 14, 2011

(30) Foreign Application Priority Data
Oct. 9, 2009 (KR) .................. 10-2009-0096337

(51) Int. Cl.
H01L 29/08 (2006.01)
(52) U.S. Cl.
USPC .............................. 257/40; 257/89
(58) Field of Classification Search
USPC .................................................. 257/40, 59
See application file for complete search history.

(56) References Cited

U.S. PATENT DOCUMENTS

| | | | |
|---|---|---|---|
| 6,833,668 B1 * | 12/2004 | Yamada et al. ............... | 313/505 |
| 7,999,258 B2 * | 8/2011 | Lee et al. ..................... | 257/59 |
| 8,053,975 B2 * | 11/2011 | Chun et al. .................. | 313/504 |
| 8,227,816 B2 * | 7/2012 | Kim et al. .................... | 257/89 |
| 2005/0191448 A1 * | 9/2005 | Suh et al. .................... | 428/32.69 |
| 2006/0094166 A1 * | 5/2006 | Kim et al. .................... | 438/142 |
| 2006/0125390 A1 * | 6/2006 | Oh ................................ | 313/506 |
| 2006/0182034 A1 | 8/2006 | Klinker | |
| 2007/0132365 A1 * | 6/2007 | Kang et al. .................. | 313/500 |
| 2007/0145350 A1 * | 6/2007 | Kobori ......................... | 257/13 |
| 2008/0049615 A1 | 2/2008 | Bugenhagen | |
| 2008/0111484 A1 * | 5/2008 | Kwon et al. ................. | 313/506 |
| 2008/0163923 A1 * | 7/2008 | Park et al. ................... | 136/248 |
| 2008/0218091 A1 | 9/2008 | Jo et al. | |
| 2008/0284324 A1 * | 11/2008 | Chun et al. ................. | 313/504 |
| 2009/0045735 A1 * | 2/2009 | Matsunami et al. ........ | 313/504 |
| 2009/0137074 A1 * | 5/2009 | Lee et al. .................... | 438/29 |
| 2010/0051973 A1 | 3/2010 | Kobayashi et al. | |
| 2010/0117517 A1 * | 5/2010 | Cok et al. ................... | 313/503 |
| 2010/0127263 A1 * | 5/2010 | Lee et al. .................... | 257/59 |
| 2010/0151622 A1 * | 6/2010 | Suh et al. .................... | 438/99 |

FOREIGN PATENT DOCUMENTS

| | | |
|---|---|---|
| JP | 2006-156403 A | 6/2006 |
| KR | 10-2006-0025774 A | 3/2006 |
| KR | 10-2006-0076937 A | 7/2006 |
| KR | 10-2006-0078548 | 7/2006 |
| KR | 10-2008-0062308 | 7/2008 |

* cited by examiner

Primary Examiner — Kimberly Rizkallah
Assistant Examiner — Caleb Henry
(74) Attorney, Agent, or Firm — Robert E. Bushnell, Esq.

(57) ABSTRACT

An organic light emitting diode display includes a substrate, a first conductive layer disposed on the substrate, a second conductive layer formed on the first conductive layer, a third conductive layer formed on the first conductive layer or the second conductive layer. A first electrode disposed on the substrate at a display area, the first electrode including at least the first conductive layer, the second conductive layer, and the third conductive layer. An organic emissive layer is disposed on the first electrode. A second electrode is formed on the organic emissive layer. A pad is disposed on the substrate at a pad area neighboring the display area. The pad has the first conductive layer and the third conductive layer surrounding the lateral side of the first conductive layer.

8 Claims, 11 Drawing Sheets

ORGANIC LIGHT EMITTING DIODE DISPLAY AND METHOD OF MANUFACTURING THE SAME

CLAIM OF PRIORITY

This application makes reference to, incorporates the same herein, and claims all benefits accruing under 35 U.S.C. §119 from an application entitled ORGANIC LIGHT EMITTING DIODE DISPLAY AND METHOD OF MANUFACTURING THE SAME earlier filed in the Korean Industrial Property Office on 9 Oct. 2009, and there duly assigned Serial No. 10-2009-0096337 by that Office.

BACKGROUND OF THE INVENTION

1. Field of the Invention

The present invention relates generally to an organic light emitting diode (OLED) display and a method of manufacturing the same, and more particularly, to an organic light emitting diode display with a pad and a manufacturing method thereof.

2. Description of the Related Art

Generally, an organic light emitting diode display includes a thin film transistor, an anode and a cathode facing each other, and an organic emissive layer disposed between the anode and the cathode.

An organic light emitting diode display where the thin film transistor has source and drain electrodes, and the drain electrode of the thin film transistor is integrally formed with the anode in a body, has been recently developed. With such an organic light emitting diode display, a pad, which is disposed at a pad area neighboring the display area with the organic emissive layer and exposed to the outside, is formed with substantially the same material as the anode. That is, the drain electrode, the anode, and the pad are formed with substantially the same material.

Meanwhile, the organic light emitting diode displays are classified into a front emission type, a rear emission type, and a one panel dual emission type, depending upon the light emitting direction thereof. Among them, the front emission type is advantageous in the aspect of optical aperture ratio, and the anode should contain a high reflective metal in order to construct a front emission type of organic light emitting diode display.

However, with the organic light emitting diode display where the drain electrode, the anode, and the pad are formed with substantially the same material, if the anode contains an easily oxidizable metal with high reflectivity and low electrical resistivity such as silver (Ag), the pad exposed to the outside also contains such an easily oxidizable metal so that it is liable to be oxidized.

The above information disclosed in this Background section is only for enhancement of understanding of the background of the described technology and therefore it may contain information that does not form the prior art that is already known in this country to a person of ordinary skill in the art.

SUMMARY OF THE INVENTION

The present invention has been developed in an effort to provide an organic light emitting diode display having advantages of preventing a pad from being oxidized even when the pad contain an easily oxidizable metal.

An exemplary embodiment provides an organic light emitting diode display including a substrate, a first conductive layer disposed on the substrate, a second conductive layer formed on the first conductive layer, a third conductive layer formed on the first conductive layer or the second conductive layer. A first electrode is disposed on the substrate at a display area, the first electrode including at least the first conductive layer among the first conductive layer, the second conductive layer, and the third conductive layer. An organic emissive layer is disposed on the first electrode. A second electrode is formed on the organic emissive layer. A pad is disposed on the substrate at a pad area neighboring the display area. The pad has the first conductive layer and the third conductive layer surrounding the lateral side of the first conductive layer.

The first conductive layer may include a first sub-conductive layer containing silver (Ag), and a second sub-conductive layer disposed on the first sub-conductive layer. The second sub-conductive layer may contain a transparent conductive material. The first conductive layer of the pad may open at the top side thereof such that the second sub-conductive layer of the first conductive layer is exposed through the opening.

The organic emissive layer may include a first sub-organic emissive layer emitting red-based light, a second sub-organic emissive layer emitting green-based light, and a third sub-organic emissive layer emitting blue-based light.

The first electrode may include a first sub-electrode corresponding to the first sub-organic emissive layer and having the first conductive layer, the second conductive layer, and the third conductive layer with a first thickness, a second sub-electrode corresponding to the second sub-organic emissive layer and having the first conductive layer and the third conductive layer with a second thickness that is smaller than the first thickness, and a third sub-electrode corresponding to the third sub-organic emissive layer and having the first conductive layer with a third thickness that is smaller than the second thickness.

The organic light emitting diode display may further include a thin film transistor formed on the substrate with source and drain electrodes each having at least in the first conductive layer, the second conductive layer, and the third conductive layer.

The source electrode, the drain electrode, the first electrode, and the pad may be formed in a simultaneous manner. At least one of the second conductive layer and the third conductive layer may have a transparent conductive material. The first conductive layer of the pad may be wholly surrounded by the third conductive layer.

Additionally, there is a method of manufacturing an organic light emitting diode display having a substrate, a first conductive layer disposed on the substrate, a second conductive layer formed on the first conductive layer, and a third conductive layer formed on the first conductive layer or the second conductive layer, a first electrode and a pad are formed on a substrate such that the first electrode is disposed at a display area and the pad is disposed at a pad area neighboring the display area. The first electrode has at least the first conductive layer, the second conductive layer, and the third conductive layer. The pad has the first conductive layer and the third conductive layer surrounding the lateral side of the first conductive layer. According to the method, an organic emissive layer is formed on the first electrode, and a second electrode is formed on the organic emissive layer.

The first conductive layer may be formed by forming a second sub-conductive layer on a first sub-conductive layer containing silver (Ag). The step of forming the pad may include opening the top side of the first conductive layer such that the second sub-conductive layer of the first conductive layer is exposed to the outside.

The step of forming the organic emissive layer may include forming a first sub-organic emissive layer emitting red-based light, forming a second sub-organic emissive layer emitting green-based light, and forming a third sub-organic emissive layer emitting blue-based light.

The step of forming the first electrode may include forming a first sub-electrode corresponding to the first sub-organic emissive layer and having the first conductive layer, the second conductive layer, and the third conductive layer with a first thickness, a second sub-electrode corresponding to the second sub-organic emissive layer and having the first conductive layer and the third conductive layer with a second thickness that is smaller than the first thickness, and a third sub-electrode corresponding to the third sub-organic emissive layer and having the first conductive layer with a third thickness that is smaller than the second thickness.

The step of forming the first electrode and the pad may be conducted through photolithography.

The step of forming the first electrode and the pad may further include sequentially forming a first conductive layer and a second conductive layer on the substrate, forming a first photoresist pattern corresponding to the first electrode and the pad on the second conductive layer, etching the first conductive layer and the second conductive layer by using the first photoresist pattern as a mask, removing the second conductive layer corresponding to the second sub-electrode, the third sub-electrode, and the pad, forming the third conductive layer on the substrate, forming a second photoresist pattern corresponding to the first sub-electrode, the second sub-electrode, and the pad on the third conductive layer, and etching the third conductive layer by using the second photoresist pattern as a mask.

The step of forming the first photoresist pattern may be conducted such that the first photoresist pattern portion corresponding to the first sub-electrode is larger in thickness than other first photoresist pattern portions, and the step of removing the second conductive layer may be conducted through dry etching.

The step of forming the first electrode and the pad may further include removing the first photoresist pattern and removing the second photoresist pattern.

With an organic light emitting diode display according to an exemplary embodiment, even if the pad contains an easily oxidizable metal, the pad can be prevented from being oxidized.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
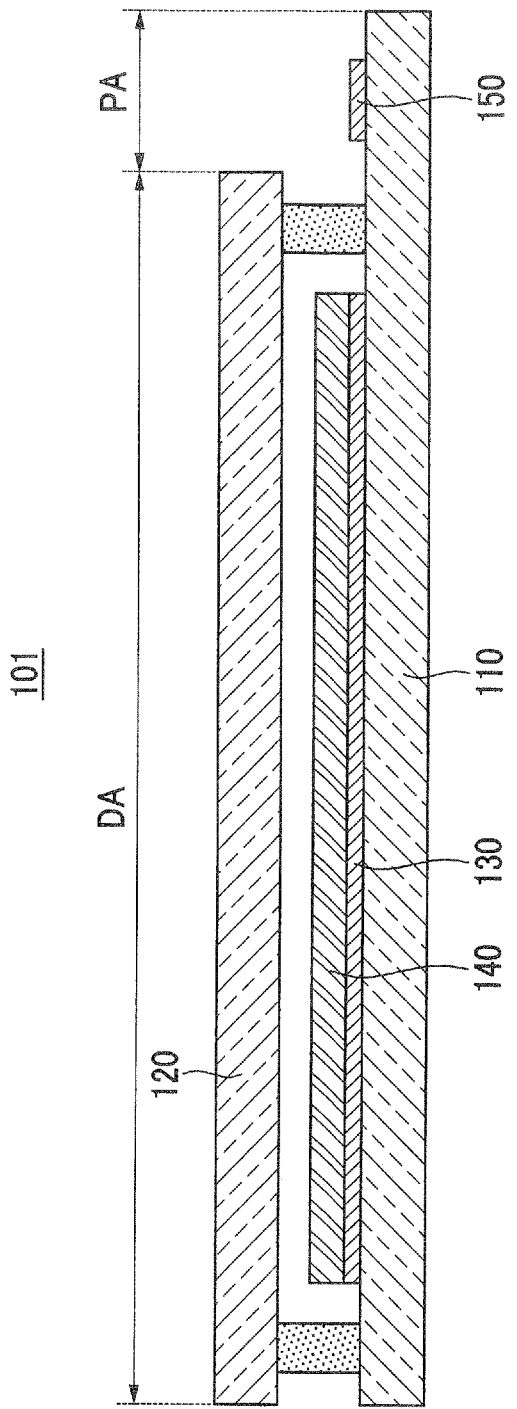
FIG. 1 is a cross-sectional view of an organic light emitting diode display according to a first exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Furthermore, with exemplary embodiments, detailed description is given for the constituent elements in the first exemplary embodiment with reference to the relevant drawings by using the same reference numerals for the same constituent elements, while only the constituent elements that are different from those related to the first exemplary embodiment are described in other exemplary embodiments.

Parts that are irrelevant to the description are omitted in order to clearly describe the present invention, and like reference numerals designate like elements throughout the specification.

Furthermore, as the size and thickness of the respective structural components shown in the drawings are arbitrarily illustrated for explanatory convenience, the present invention is not necessarily limited to as illustrated.

In the drawings, the thickness of layers, films, panels, regions, etc., are wholly or partially exaggerated for clarity and explanatory convenience. It will be understood that when an element such as a layer, film, region, or substrate is referred to as being "on" another element, it can be directly on the other element or intervening elements may also be present. By contrast, it will be understood that when an element is referred to as being "directly on" another element, no intervening elements are present.

Illustrated in the appended drawings is an active matrix (AM) type of organic light emitting diode display panel with a 2Tr-1Cap structure where a pixel is provided with two thin film transistors (TFT) and one capacitor, but the present invention is not limited thereto. The organic light emitting diode display panel is not limited in the number of thin film transistors, capacitors, or wires. A pixel is a minimum image displaying unit, and the organic light emitting diode display panel displays images through a plurality of pixels.

An organic light emitting diode display according to a first exemplary embodiment will now be described with reference to FIG. 1 to FIG. 4.

FIG. 1 is a cross-sectional view of an organic light emitting diode display according to a first exemplary embodiment.

As shown in FIG. 1, an organic light emitting diode display 101 according to a first exemplary embodiment is demarcated into a display area DA and a pad area PA neighboring the display area DA, and includes a first substrate 110, a second substrate 120, a driving circuit 130, an organic light emitting diode 140, and a pad 150.

Figure 2:
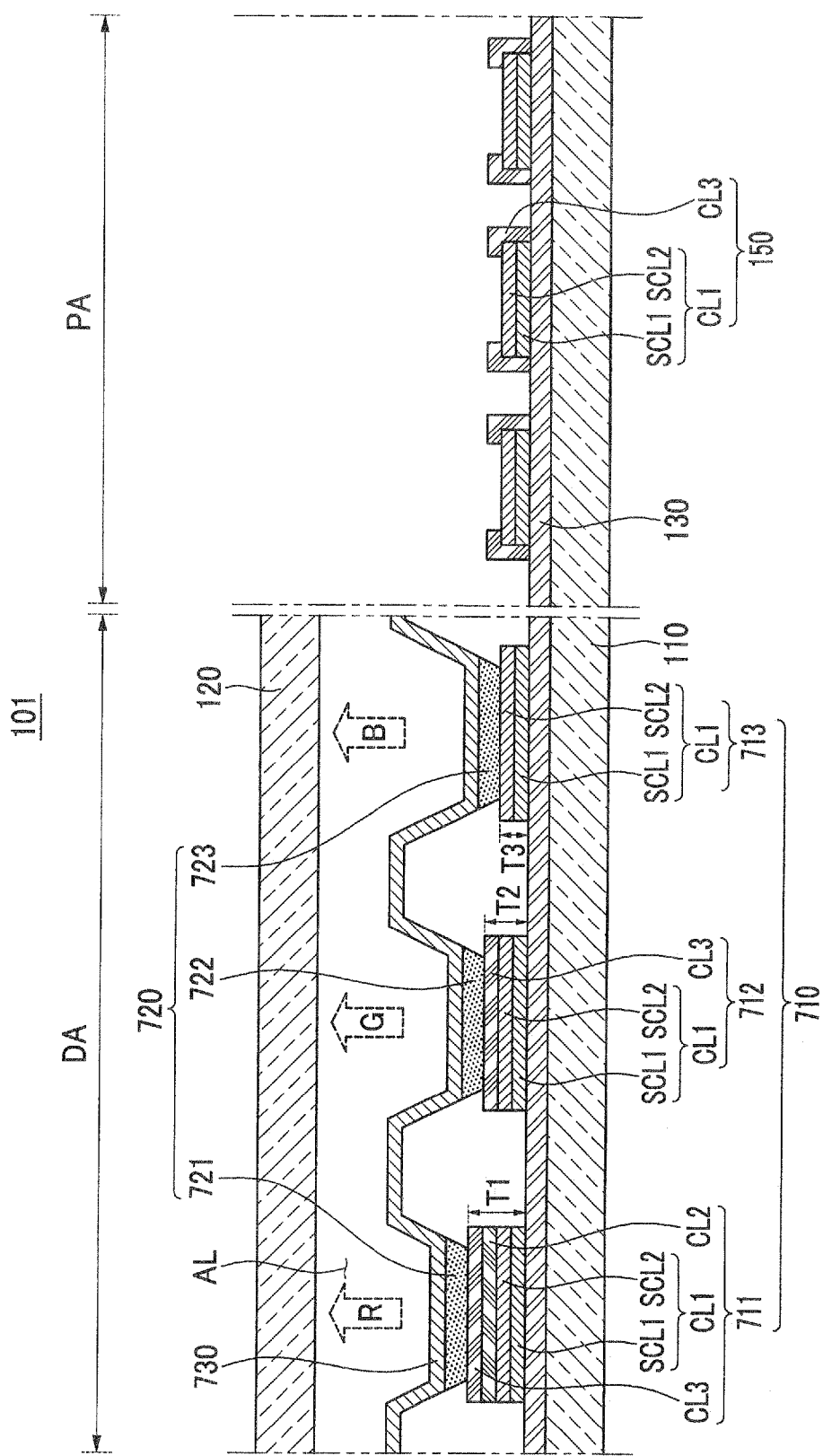
FIG. 2 an enlarged sectional view of an organic light emitting diode display according to the first exemplary embodiment.

FIG. 2 is an enlarged sectional view of the organic light emitting diode display of FIG. 1.

As shown in FIG. 2, the first substrate 110 is formed with an insulating substrate based on glass, quartz, ceramic, or plastic. However, the first exemplary embodiment is not limited thereto, and the first substrate 110 may be formed with a metallic substrate based on stainless steel or other metals.

The second substrate 120 faces the first substrate 110, and covers the driving circuit 130 and the organic light emitting diode 140. The first and the second substrates 110 and 120 are assembled with each other in a sealed manner so as to protect the driving circuit 130 and the organic light emitting diode 140. The second substrate 120 is disposed on the organic light emitting diode 140 while being spaced apart therefrom by a distance, and an air layer (AL) is formed between the second substrate 120 and the organic light emitting diode 140. The second substrate 120 is formed with a transparent material such as glass, quartz, or plastic.

The driving circuit 130 and the organic light emitting diode 140 formed on the first substrate 110 are disposed between the first and second substrates 110 and 120.

The driving circuit 130 is formed on the first substrate 110. The driving circuit 130 includes switching and driving thin film transistors 10 and 20 (shown in FIG. 3), respectively, and drives the organic light emitting diode 140. That is, the organic light emitting diode 140 emits light in accordance with driving signals transmitted from the driving circuit 130, and displays images upward in the direction of the second substrate 120.

Figure 3:
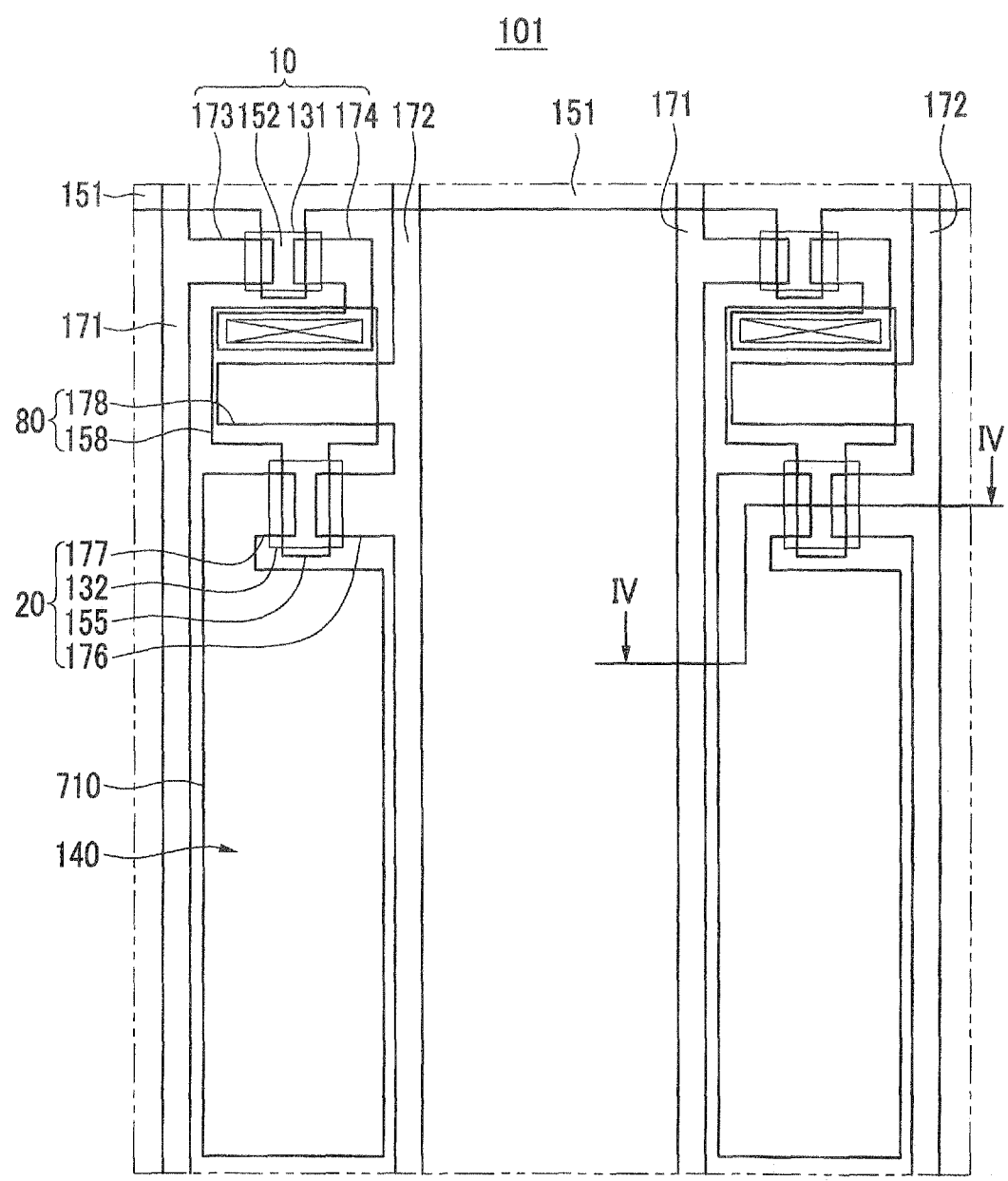
FIG. 3 is a layout view of a pixel structure of an organic light emitting diode display according to the first exemplary embodiment.
Figure 4:
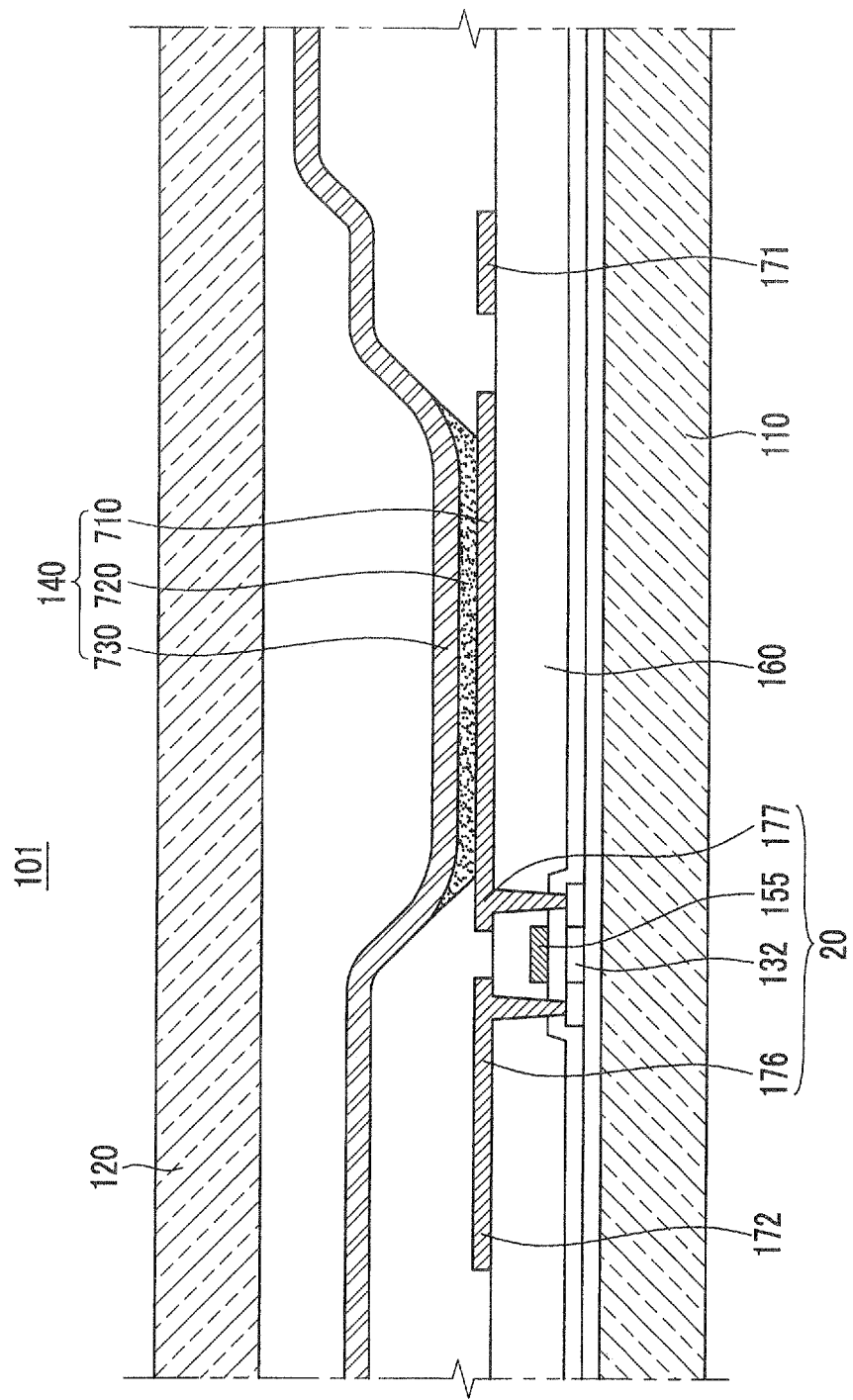
FIG. 4 is a cross-sectional view of the light emitting diode display taken along the line IV-IV of FIG. 3.

A specific structure of the driving circuit 130 is illustrated in FIG. 3 and FIG. 4, but an exemplary embodiment is not limited to that structure. The structure of the driving circuit 130 may be variously modified provided that such modifications can be easily made by a person skilled in the art.

The organic light emitting diode 140 emits light in accordance with the driving signals transmitted from the driving circuit 130. The organic light emitting diode 140 includes a first electrode 710 being the anode, an organic emissive layer 720 formed on the first electrode 710, and a second electrode 730 formed on the organic emissive layer 720 as the cathode. However, the first exemplary embodiment is not limited thereto. That is, the first electrode 710 may function as the cathode, while the second electrode 730 functions as the anode.

The first electrode 710, the organic emissive layer 720, and the second electrode 730 are sequentially deposited on the first substrate 110 at the display (or pixel) area DA.

The first electrode 710 contains a reflective metal, and the second electrode 730 is formed with a transparent conductive material. Accordingly, the light generated from the organic emissive layer 720 is emitted while being passed through the second electrode 730. That is, with the first exemplary embodiment, the organic light emitting diode display 101 has a front emission type of structure. The first electrode 710 includes a first sub-electrode 711, a second sub-electrode 712, and a third sub-electrode 713.

The first sub-electrode 711 corresponds to a first sub-organic emissive layer 721 emitting red-based light R, to be described later, and includes a first conductive layer CL1, a second conductive layer CL2, and a third conductive layer CL3 deposited sequentially.

The first conductive layer CL1 includes a first sub-conductive layer SCL1 containing silver (Ag) with high reflectivity and low electrical resistivity as a reflective metal, and a second sub-conductive layer SCL2 placed on the first sub-conductive layer SCL1 with the content of a transparent conductive material. Here, the transparent conductive material may be indium tin oxide (ITO), indium zinc oxide (IZO), zinc oxide (ZnO), or indium oxide (In2O3).

The second conductive layer CL2 is disposed on the first conductive layer CL1, and contains a transparent conductive material.

The third conductive layer CL3 is disposed on the second conductive layer CL2, and contains a transparent conductive material. The transparent conductive material contained in the second conductive layer CL2 and the third conductive layer CL3 may be indium tin oxide or indium zinc oxide.

The first sub-electrode 711 including the first conductive layer CL1, the second conductive layer CL2, and the third conductive layer CL3 has a total first thickness T1.

The second sub-electrode 712 corresponds to a second sub-organic emissive layer 722 emitting green-based light G, to be described later, and includes a first conductive layer CL1 and a third conductive layer CL3 deposited sequentially.

The first conductive layer CL1 includes a first sub-conductive layer SCL1 and a second sub-conductive layer SCL2, and the third conductive layer CL3 is disposed on the first conductive layer CL1 with the content of a transparent conductive material.

The second sub-electrode 712 including the first conductive layer CL1 and the third conductive layer CL3 has a total second thickness T2 that is smaller than the first thickness T1 of the first sub-electrode 711.

The third sub-electrode 713 corresponds to a third sub-organic emissive layer 723 emitting blue-based light B, to be described later, and contains a first conductive layer CL1.

The first conductive layer CL1 includes a first sub-conductive layer SCL1 and a second sub-conductive layer SCL2.

The third sub-electrode 713 includes a first conductive layer CL1, and has a third thickness T3 that is smaller than the second thickness T2 of the second sub-electrode 712.

As described above, the first sub-electrode 711, the second sub-electrode 712, and the third sub-electrode 713 of the first electrode 710 have the first thickness T1, the second thickness T2, and the third thickness T3, respectively, which differ from one another. That is, the first sub-electrode 711, the second sub-electrode 712, and the third sub-electrode 713 are differentiated in thickness from one another.

The organic emissive layer 720 has a multiple-layered structure (not illustrated) including some or all of an emission layer, a hole injection layer (HIL), a hole transporting layer (HTL), an electron transporting layer (ETL), and an electron injection layer (EIL). If the organic emissive layer 720 includes all the layers, the hole injection layer (HIL) is disposed on the first electrode 710 being the anode, and is sequentially overlaid with the hole transporting layer (HTL), the emission layer, the electron transporting layer (ETL), and the electron injection layer (EIL). Furthermore, the organic emissive layer 720 may have other layers when needed.

The organic emissive layer 720 includes the first sub-organic emissive layer 721, the second sub-organic emissive layer 722, and the third sub-organic emissive layer 723.

The first sub-organic emissive layer 721 corresponds to the first sub-electrode 711, and emits red-based light R.

The second sub-organic emissive layer 722 corresponds to the second sub-electrode 712, and emits green-based light G.

The third sub-organic emissive layer 723 corresponds to the third sub-electrode 713, and emits blue-based light B. However, the first exemplary embodiment is not necessarily limited thereto, and the organic emissive layer 720 may emit another color of light.

The dotted-lined arrows of FIG. 2 indicate the progression of the color light emitted from the organic emissive layer 720, and the reference letters R, G, and B represent the initials of the color of light emitted from the organic emissive layer 720. That is, R represents red light, G represents green light, and B represents blue light.

The second electrode 730 is disposed on the organic emissive layer 720, and contains a transparent conductive material.

As described above, the first electrode 710 of the organic light emitting diode display 101 according to the first exemplary embodiment has a first sub-electrode 711, a second sub-electrode 712, and a third sub-electrode 713 that are differentiated in thickness such that the maximum constructive interference can be made per respective wavelengths of the different-colored light emitted from the first sub-organic emissive layer 721, the second sub-organic emissive layer 722, and the third sub-organic emissive layer 723, and accordingly, the optical efficiency of the light emitted from the first sub-electrode 711, the second sub-electrode 712, and the third sub-electrode 713 respectively can be maximized per respective colors. That is, as the optical efficiency of the light emitted from the first sub-organic emissive layer 721, the second sub-organic emissive layer 722, and the third sub-organic emissive layer 723, respectively, is maximized per the respective colors, the whole color reproducibility of the organic light emitting diode display 101 is improved.

Furthermore, with the first exemplary embodiment, the structure of the organic light emitting diode 140 is not limited to as above-described. The structure of the organic light emitting diode 140 may be variously modified provided that such modifications can be easily made by a person skilled in the art.

A pad 150 is positioned at a pad area PA neighboring the display area DA with the organic light emitting diode 140.

The pad 150 is located at the pad area PA exposed to the outside, and is electrically connected to the first electrode 710. The pad 150 is formed simultaneously with the first electrode 710, and includes a first conductive layer CL1 and a third conductive layer CL3. The top side of the first conductive layer CL1 is open such that the second sub-conductive layer SCL2 of the first conductive layer CL1 is exposed to the outside. The third conductive layer CL3 of the pad 150 surrounds the lateral sides of the first conductive layer CL1. As the third conductive layer CL3 of the pad 150 surrounds the lateral sides of the first conductive layer CL1, the lateral sides of the first sub-conductive layer SCL1 of the first conductive layer CL1 of the pad 150 is blocked from being exposed to the outside by the third conductive layer CL3.

As described above, the first sub-conductive layer SCL1 of the first conductive layer CL1 of the pad 150 contains an easily oxidizable metal with low electrical resistivity such as silver (Ag). However, as the second sub-conductive layer SCL2 containing a transparent conductive material is disposed on the first sub-conductive layer SCL1 and the third conductive layer CL3 containing a transparent conductive material surrounds the lateral sides of the first sub-conductive layer SCL1, the first sub-conductive layer SCL1 of the first conductive layer CL1 of the pad 150 is blocked from being expose to the outside so that it is not oxidized through the reaction with external oxygen. That is, although the first sub-conductive layer SCL1 of the first conductive layer CL1 of the pad 150 is formed simultaneously with the first electrode 710 while containing an easily oxidizable material with high reflectivity and low electrical resistivity, the pad 150 is prevented from being oxidized because the second sub-conductive layer SCL2 and the third conductive layer CL3 surround the first sub-conductive layer SCL1. The pad 150 may be electrically connected to an integrated circuit (IC) chip while directly contacting a conductive film functioning as an electrical interface, such as an anisotropic conductive film.

The internal structure of the organic light emitting diode display 101 according to the first exemplary embodiment will now be described with reference to FIG. 3 and FIG. 4.

FIG. 3 is a layout view of a pixel structure of the organic light emitting diode display according to the first exemplary embodiment. FIG. 4 is a cross-sectional view of the organic light emitting diode display taken along the - line of FIG. 3.

As shown in FIG. 3 and FIG. 4, the organic light emitting diode display 101 includes a switching thin film transistor 10, a driving thin film transistor 20, a storage capacitor 80, and an organic light emitting diode (OLED) 140. Here, the driving circuit 130 refers to the structure with the switching thin film transistor 10, the driving thin film transistor 20, and the storage capacitor 80. The driving circuit 130 includes gate lines 151 arranged in a direction of the substrate 110, and data lines 171 and common power lines 172 crossing the gate lines 151 in an insulated manner. Here, a pixel is defined by the gate lines 151 and the data and common power lines 171 and 172, but is not limited thereto.

The organic light emitting diode 140 includes a first electrode 710, and as illustrated in FIG. 4, an organic emissive layer 720 formed on the first electrode 710, and a second electrode 730 formed on the organic emissive layer 720. Here, the first electrode 710 functions as a positive (+) electrode being the hole injection electrode, and the second electrode 730 functions as a negative (−) electrode being the electron injection electrode. Holes and electrons are injected from the first and second electrodes 710 and 730 into the organic emissive layer 720, and when exitons being combinations of the holes and electrons injected into the organic emissive layer drop from an excited state to a ground state, the organic emissive layer 720 emits light.

As illustrated in FIG. 4 that the first electrode 710 has a single-layered structure, but this is only for better understanding and ease of description. With the organic light emitting diode display 101 according to the first exemplary embodiment, it is described as above that the first electrode 710 may include at least one of the first conductive layer CL1, the second conductive layer CL2, and the third conductive layer CL3, depending upon the color of light emitted from the organic emissive layer 720.

The storage capacitor 80 includes a pair of capacitor plates 158 and 178 arranged by interposing an interlayer insulating layer 160 therebetween. The interlayer insulating layer 160 functions as a dielectric, and the capacitance of the storage capacitor 80 is determined by charges charged at the storage capacitor 80 and the voltages of the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The driving source electrode 176 and the driving drain electrode 177 are formed simultaneously with the first electrode 710, and may include at least one of the first conductive layer CL1, the second conductive layer CL2, and the third conductive layer CL3, as with the first electrode 710. That is, the driving source electrode 176 and the driving drain electrode 177 are formed simultaneously with the first electrode 710 and the pad 150.

The switching thin film transistor 10 is used as a switch for selecting a pixel to be excited. The switching gate electrode 152 is connected to the gate line 151. The switching source electrode 173 is connected to the data line 171. The switching drain electrode 174 is spaced apart from the switching source electrode 173 by a distance, and connected to one of the capacitor plates 158.

The driving thin film transistor 20 applies power for driving the organic emissive layer 720 of the organic light emitting diode 140 to the first electrode 710. The driving gate electrode 155 is connected to the capacitor plate 158 connected with the switching drain electrode 174. The driving source electrode 176 and the other capacitor plate 178 are each are connected to the common power line 172. The driving drain electrode 177 may at the same plane as the first electrode 710 and the pad 150, and electrically connected to the first electrode 710 and the pad 150.

With the above structure, the switching thin film transistor 10 is operated by way of the gate voltage applied to the gate line 151 so as to transmit the data voltage applied to the data line 171 to the driving thin film transistor 20. A voltage corresponding to a difference between the common voltage applied from the common power line 172 to the driving thin film transistor 20 and the data voltage transmitted from the switching thin film transistor 10 is stored at the storage capacitor 80, and the current corresponding to the voltage stored at the storage capacitor 80 flows to the organic light emitting diode 140 through the driving thin film transistor 20 so that the organic light emitting diode 140 emits light. The first electrode 710 injects holes into the organic emissive layer 720, and the second electrode 730 injects electrons into the organic emissive layer 720 so that the organic light emitting diode 140 emits light.

As described above, with the organic light emitting diode display 101 according to the first exemplary embodiment, the driving drain electrode 177 of the driving thin film transistor 20, the first electrode 710, and the pad 150 are formed through the same process in order to decrease the processing time and costs. Accordingly, even if the first sub-conductive layer SCL1 of the first conductive layer CL1 forming the pad 150 exposed to the outside contains an easily oxidizable metal with low electrical resistivity such as silver (Ag), the second sub-conductive layer SCL2 and the third conductive layer CL3 block the first sub-conductive layer SCL1 from the outside so that the pad 150 is prevented from being oxidized.

Furthermore, with the organic light emitting diode display 101 according to the first exemplary embodiment, the first electrode 710 includes the first to third sub-electrodes 711, 712 and 713 that are differentiated in thickness such that maximum constructive interference can be made per wavelengths of the different color light emitted from the first to third sub-organic emissive layers 721, 722, and 723. In this way, the optical efficiency of the light emitted from the first to third sub-organic emissive layers 721, 722, and 723, respectively can be maximized per the respective colors. That is, the optical efficiency of the light emitted from the first to third sub-organic emissive layers 721, 722, and 723, respectively, is maximized per respective colors so that the whole color reproducibility of the organic light emitting diode display 101 can be improved.

A method of manufacturing an organic light emitting diode display according to a first exemplary embodiment will be described with reference to FIG. 5 to FIG. 10.

The process of forming the first electrode 710 and the pad 150 on the first substrate 110 through photolithography will be described in detail with reference to FIG. 6 to FIG. 9. When the first electrode 710 and the pad 150 are formed, a driving source electrode 176 and a driving drain electrode 177 of a driving thin film transistor 20 are formed simultaneously with the first electrode 710 and the pad 150, but the formation of the driving source electrode 176 and the driving drain electrode 177 will be omitted for better understanding and ease of description.

Figure 5:
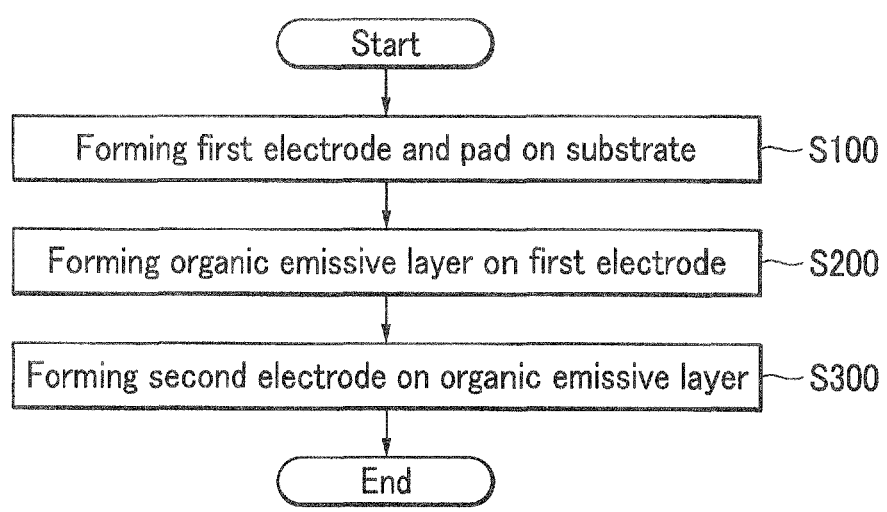
FIG. 5 is a flowchart illustrating a method of manufacturing an organic light emitting diode display according to the first exemplary embodiment.

FIG. 5 is a flowchart illustrating the process of fabricating the organic light emitting diode display according to the first exemplary embodiment. FIG. 6 to FIG. 10 are cross-sectional views illustrating the process of fabricating the organic light emitting diode display according to the first exemplary embodiment.

As shown in FIG. 5, a first electrode 710 and a pad 150 are formed on a first substrate 110 at the step S100, an organic emissive layer 720 is formed on the first electrode 710 at the step S200, and a second electrode 730 is formed on the organic emissive layer 720 at the step S300.

Figure 6:
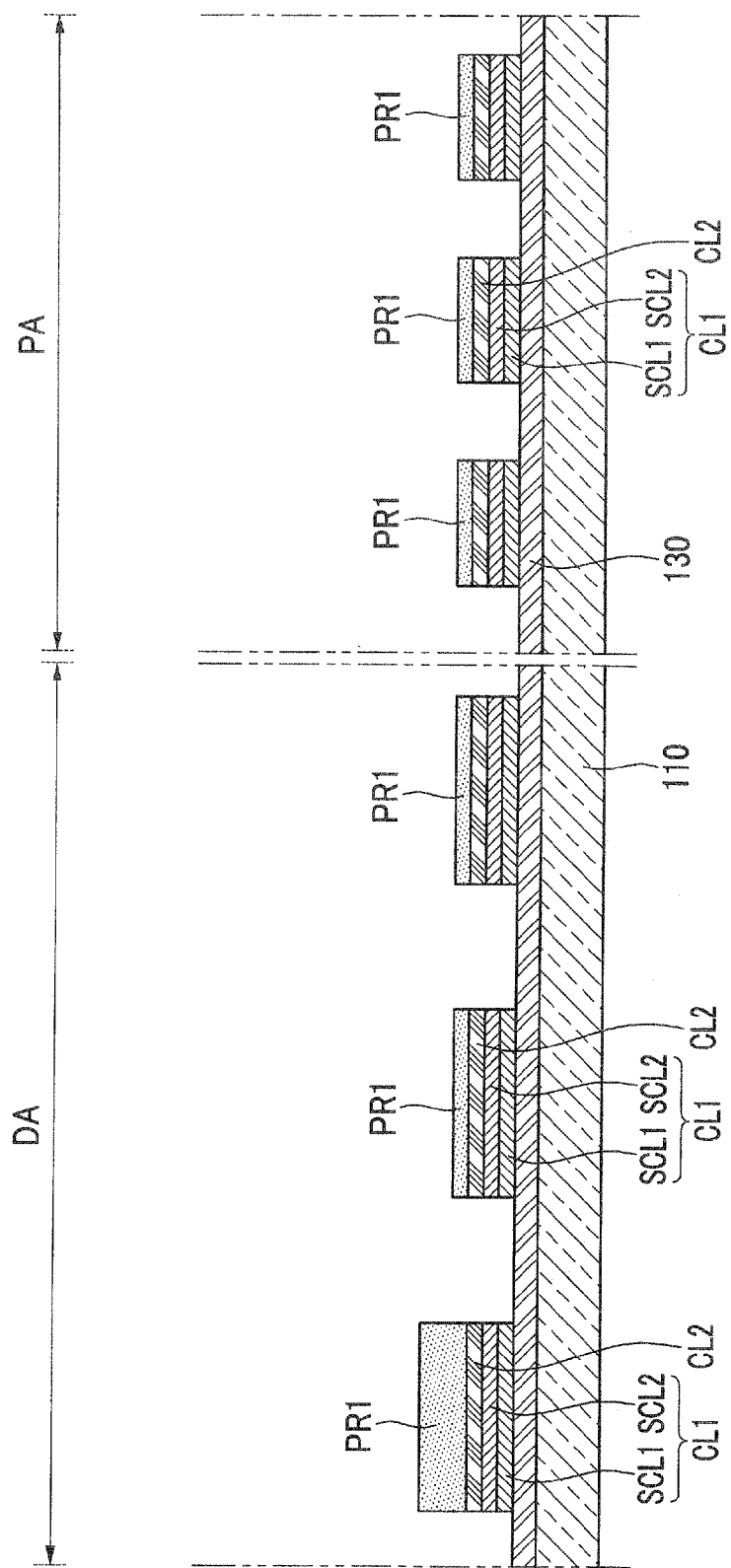
FIG. 6 to FIG. 10 are cross-sectional views illustrating a method of manufacturing an organic light emitting diode display according to the first exemplary embodiment.

As shown in FIG. 6, a driving circuit 130 is formed on the first substrate 110, and a first conductive layer CL1 and a second conductive layer CL2 are sequentially formed on the driving circuit 130 over the entire area of the first substrate 110. Here, the first conductive layer CL1 is formed through sequentially forming a first sub-conductive layer SCL1 and a second sub-conductive layer SCL2.

After a photoresist material is coated on the second conductive layer CL2, it is exposed to light and developed to thereby form a first photoresist pattern PR1 corresponding to a first electrode 710 and a pad 150 to be formed later. A structure sequentially with the first conductive layer CL1, the second conductive layer CL2, and the first photoresist pattern PR1 is formed at the locations corresponding to a first electrode 710 and a pad 150 through wet etching by using the first photoresist pattern PR1 as a mask. At this time, the first photoresist pattern portion PR1 corresponding to the first sub-electrode 711 (see FIG. 2 or 9) of the first electrode 710 is established to be larger in thickness than other photoresist pattern portions PR1.

Figure 7:
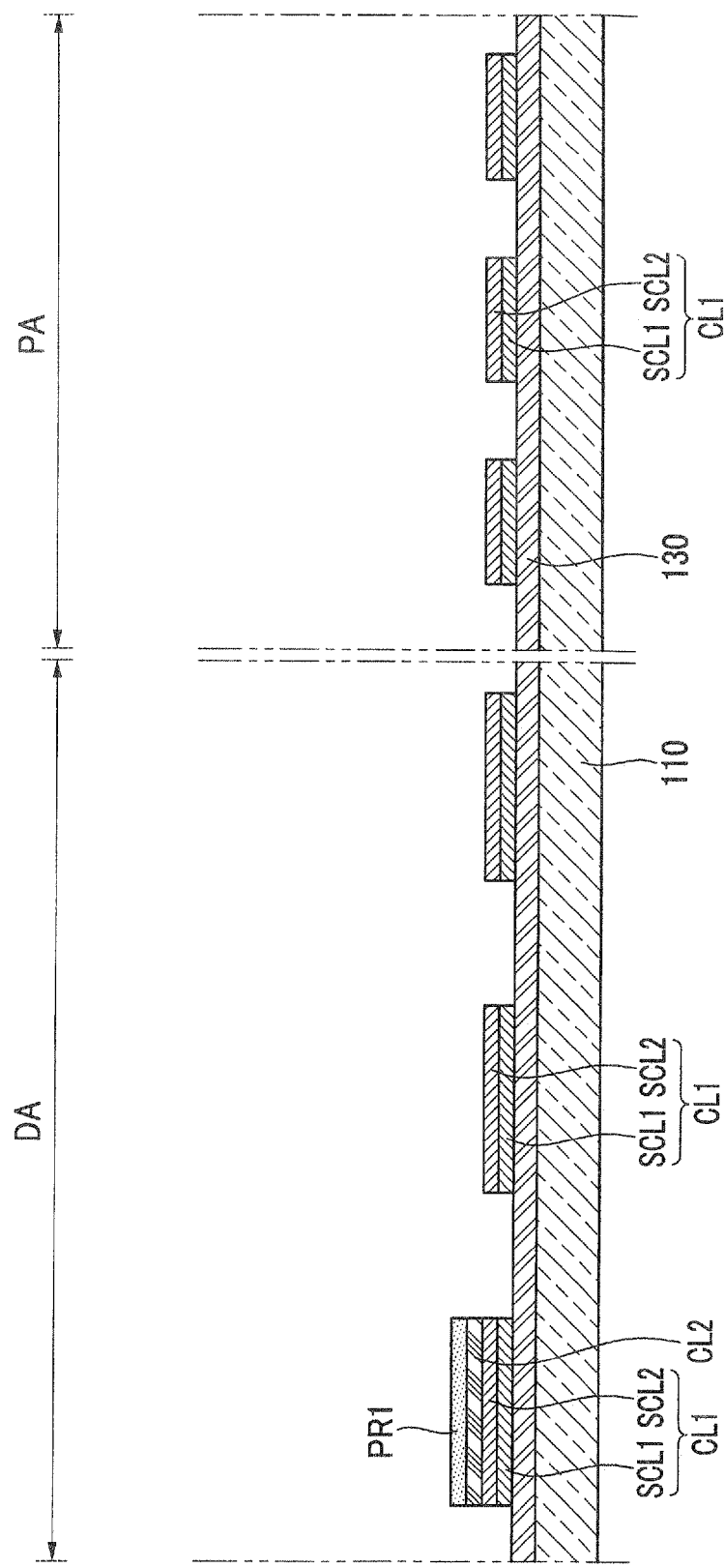

Then, as shown in FIG. 7, the second conductive layer CL2 is removed through dry etching except for the second conductive layer CL2 of the first sub-electrode 711. Since the first photoresist pattern portion PR1 corresponding to the first sub-electrode 711 of the first electrode 710 is larger in thickness than other first photoresist pattern portions PR1, then the portion of the second conductive layer CL2, formed at the location corresponding to a first sub-electrode 711 to be formed later, is not removed through the dry etching. That is, the portions of the second conductive layer CL2 corresponding to the second sub-electrode 712, the third sub-electrode 713, and the pad 150 are removed through the etching.

Figure 8:
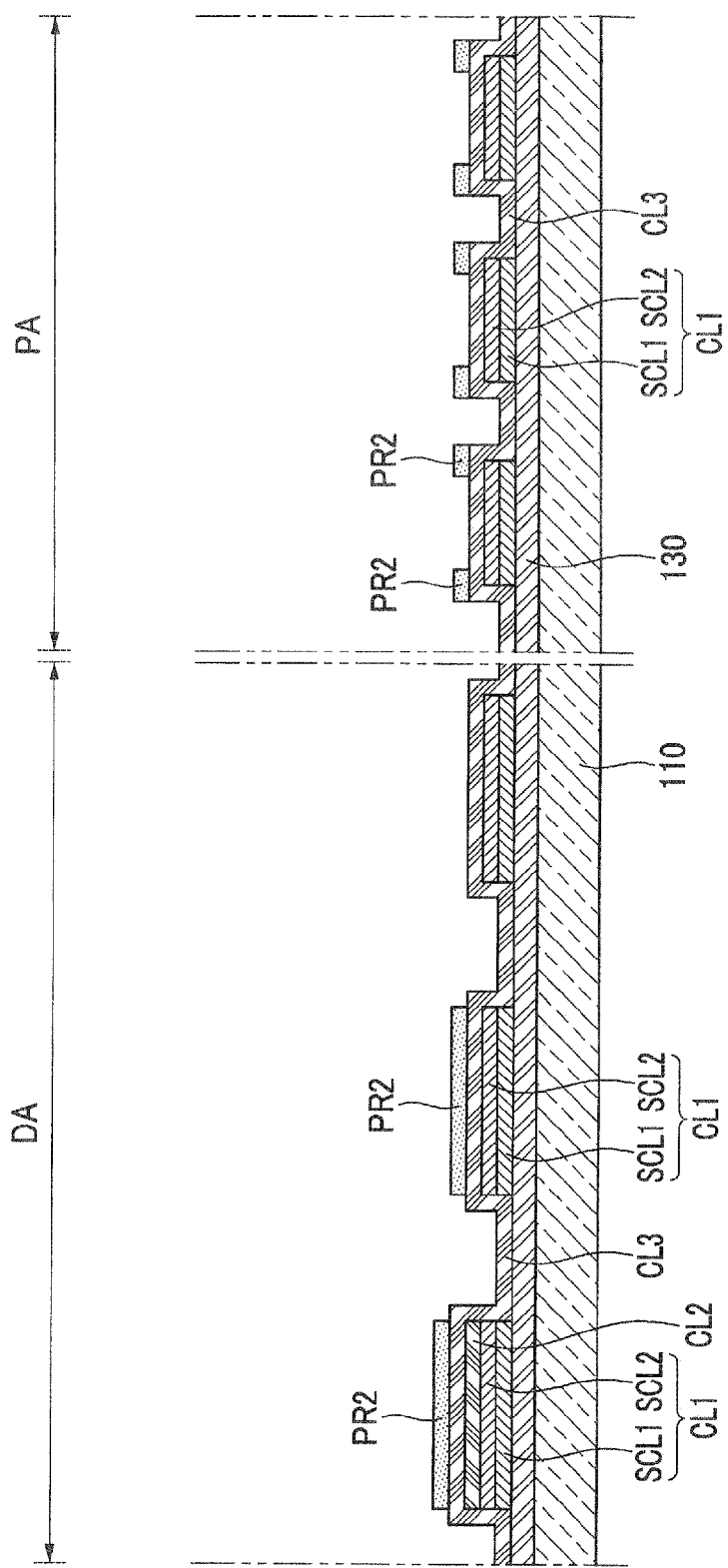

Thereafter, as shown in FIG. 8, the first photoresist pattern PR1 remaining at the location corresponding to a first sub-electrode 711 to be formed later is removed from the second conductive layer CL2 through ashing, stripping, or lifting off, and a third conductive layer CL3 is formed over the entire area of the first substrate 110.

A second photoresist pattern PR2 is then formed on the third conductive layer CL3, which corresponds to a first sub-electrode 711 and a second sub-electrode 712 to be formed later, and to the top side of a pad 150 to be formed later such that a second sub-conductive layer SCL2 of the pad 150 is exposed to the outside.

Figure 9:
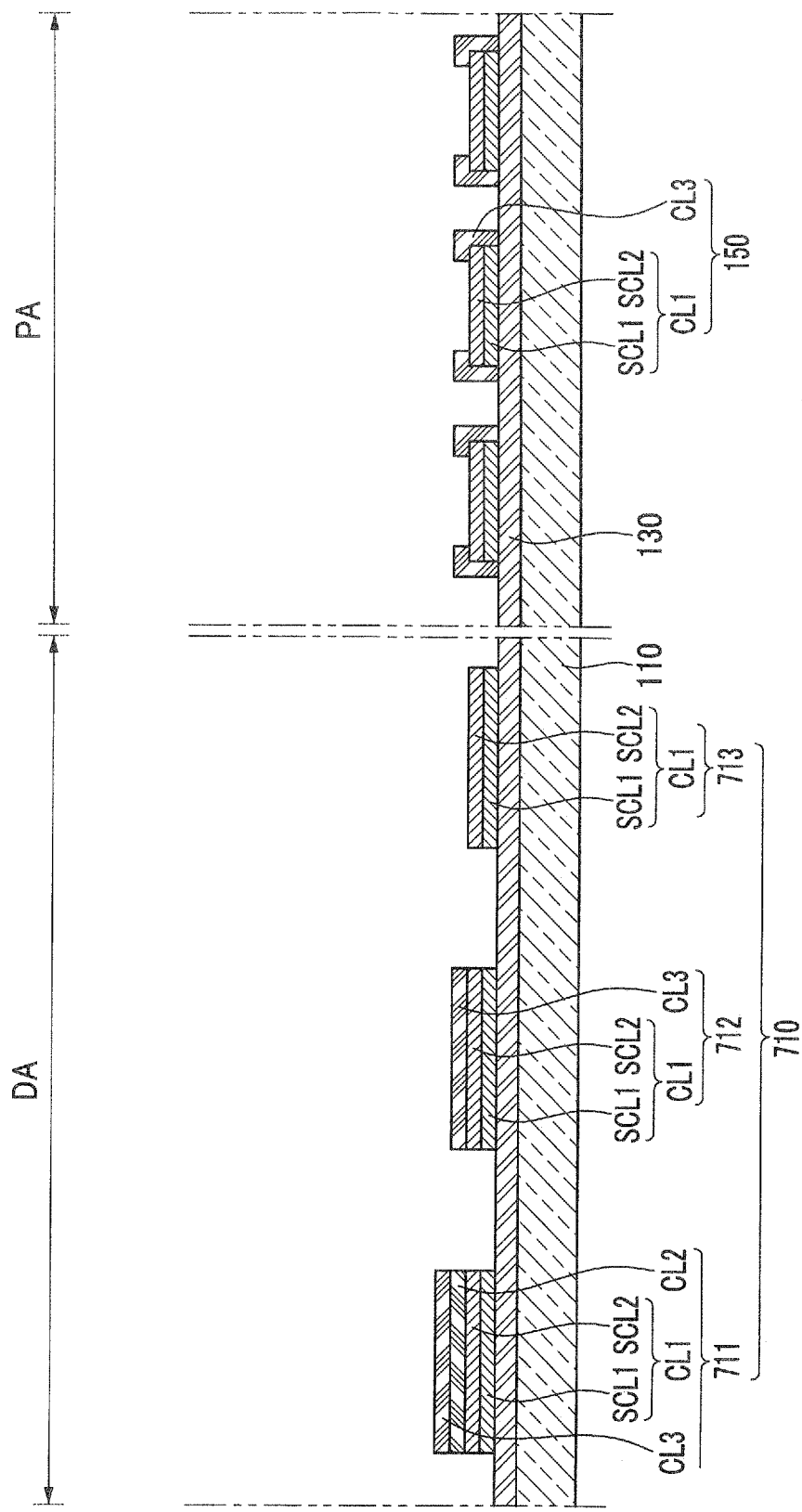

As shown in FIG. 9, the third conductive layer CL3 is etched through wet etching by using the second photoresist pattern PR2 as a mask, thereby forming a first electrode 710 and a pad 150. At this time, the first electrode 710 includes a first sub-electrode 711 with the first to third conductive layers CL1, CL2, and CL3, a second sub-electrode 712 with the first and third conductive layers CL1 and CL3, and a third sub-electrode 713 with the first conductive layer CL1. Furthermore, with the pad 150, the first sub-conductive layer SCL1 is surrounded by the second sub-conductive layer SCL2 and the third conductive layer CL3, and the top side of the first conductive layer CL1 opens such that the second sub-conductive layer SCL2 is exposed to the outside.

With the above-described process, the first electrode 710 and the pad 150 are formed on the first substrate 110, and at the same time, the driving source and drain electrodes 176 and 177 of the driving thin film transistor 20 are formed together.

Figure 10:
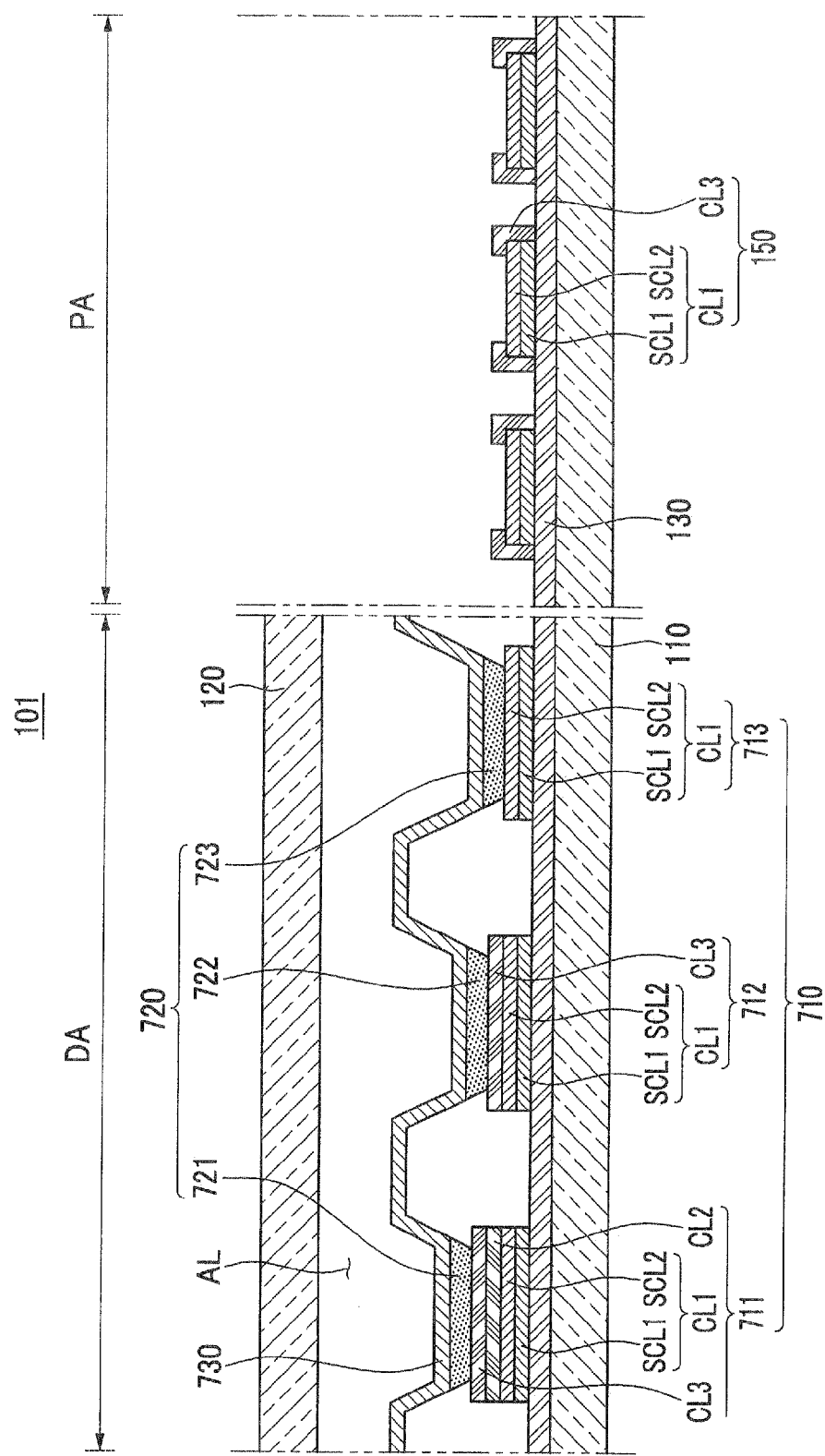

As shown in FIG. 10, an organic emissive layer 720 is formed on the first electrode 710 at the step S200.

Specifically, after a plurality of pixel definition layers are formed between the first electrode neighbors 710, a first sub-organic emissive layer 721 is formed at the location corresponding to the first sub-electrode 711, and a second sub-organic emissive layer 722 is formed at the location corresponding to the second sub-electrode 712, while a third sub-organic emissive layer 723 is formed at the location corresponding to the third sub-electrode 713.

A second electrode 730 is formed on the organic emissive layer 720 at the step S300.

As described above, with the method of manufacturing the organic light emitting diode display according to the first exemplary embodiment, the pad 150 is prevented from being oxidized, and the optical efficiency of the light emitted from the organic emissive layer 720 is maximized per respective colors. Furthermore, as the first electrode 710 and the pad 150 are formed in a simultaneous manner, the production time and costs are reduced.

An organic light emitting diode display 102 according to a second exemplary embodiment will be now described with reference to FIG. 11.

Figure 11:
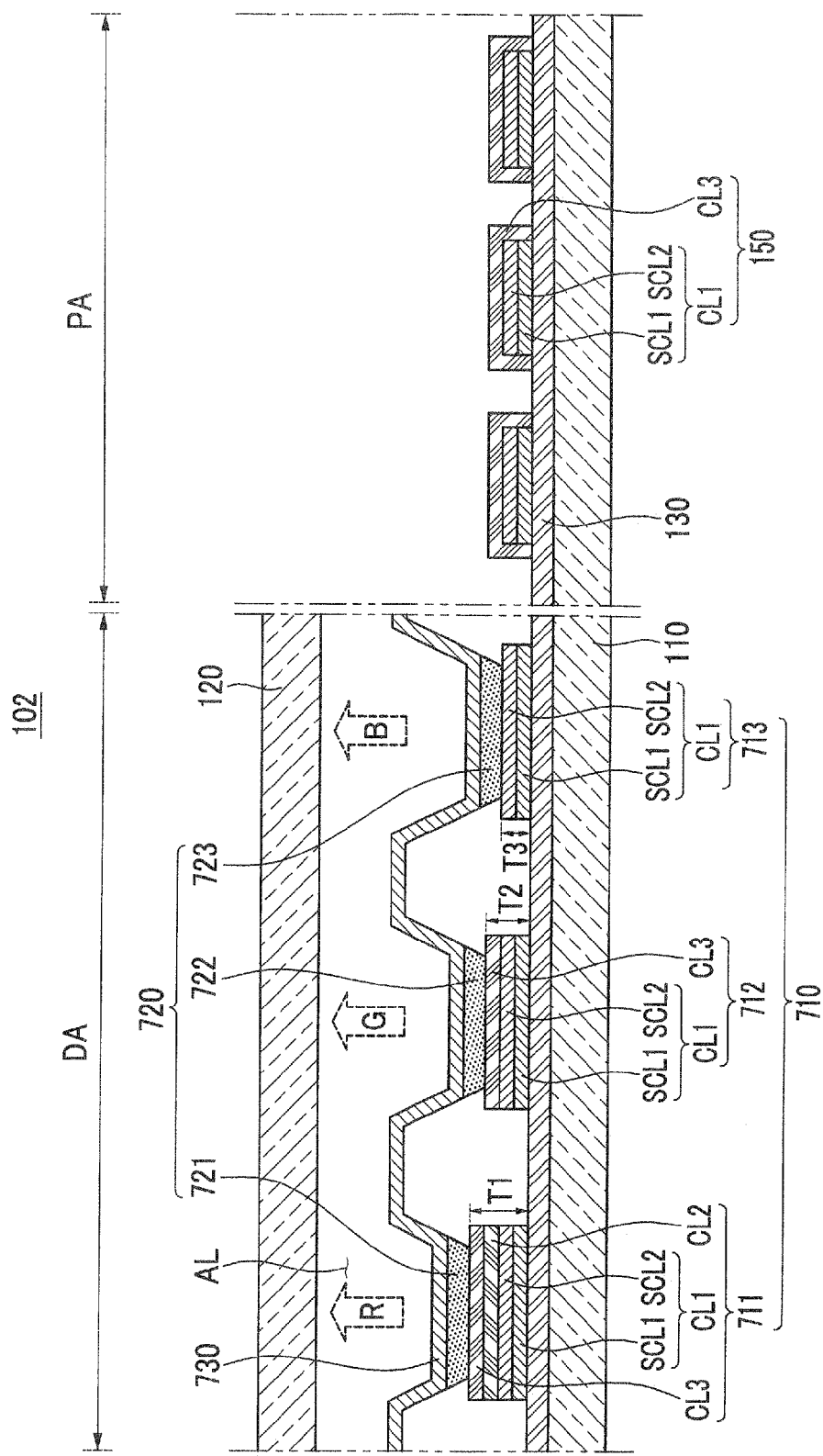
FIG. 11 is a cross-sectional view of an organic light emitting diode display according to a second exemplary embodiment.

FIG. 11 is a cross-sectional view of an organic light emitting diode display according to a second exemplary embodiment.

In FIG. 11, the pad 150 differs from the pad 150 of the first embodiment. Here the pad 150 includes the first conductive layer CL1 and the third conductive layer CL3 unetched. The first conductive layer CL1 of the pad 150 is completely surrounded by the third conductive layer CL3, and is blocked from the outside by way of the third conductive layer CL3.

As described above, with the organic light emitting diode display 102 according to the second exemplary embodiment, the first conductive layer CL1 of the pad 150 is surrounded by the third conductive layer CL3, and accordingly, even if the first conductive layer CL1 contains an easily oxidizable metal with low electrical resistivity such as silver (Ag), the first conductive layer CL1 is blocked from the outside so that it is not oxidized through the reaction with external oxygen.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display device, comprising:
    a substrate;
    a first conductive layer disposed on the substrate;
    a second conductive layer formed on the first conductive layer;
    a third conductive layer formed on the first conductive layer or the second conductive layer;
    a first electrode disposed on the substrate at a display area, the first electrode including at least the first conductive layer among the first conductive layer, the second conductive layer, and the third conductive layer;
    an organic emissive layer disposed on the first electrode;
    a second electrode formed on the organic emissive layer; and
    a pad disposed on the substrate at a pad area neighboring the display area, the pad having the first conductive layer and the third conductive layer, the third conductive layer surrounding the lateral sides of the first conductive layer, the first conductive layer comprising:
        a first sub-conductive layer containing silver, and a second sub-conductive layer disposed on the first sub-conductive layer, the third conductive layer of the pad having an opening at the top side thereof, the second sub-conductive layer of the first conductive layer being exposed through the opening of the third conductive layer.

2. The organic light emitting diode display device of claim 1, the second sub-conductive layer containing a transparent conductive material.

3. The organic light emitting diode display device of claim 1, the organic emissive layer including a first sub-organic emissive layer emitting red-based light, a second sub-organic emissive layer emitting green-based light, and a third sub-organic emissive layer emitting blue-based light.

4. The organic light emitting diode display device of claim 3, the first electrode comprising a first sub-electrode corresponding to the first sub-organic emissive layer and having the first conductive layer, the second conductive layer, and the third conductive layer with a first thickness, a second sub-electrode corresponding to the second sub-organic emissive layer and having only the first conductive layer and the third conductive layer with a second thickness that is smaller than the first thickness, and a third sub-electrode corresponding to the third sub-organic emissive layer and having only the first conductive layer with a third thickness that is smaller than the second thickness.

5. The organic light emitting diode display device of claim 4, further comprising a thin film transistor formed on the substrate with source and drain electrodes, the source and drain electrodes having at least the first conductive layer among the first conductive layer, the second conductive layer, and the third conductive layer.

6. The organic light emitting diode display device of claim 5, the source electrode, the drain electrode, the first electrode, and the pad being formed in a simultaneous manner.

7. The organic light emitting diode display device of claim 6, at least one of the second conductive layer and the third conductive layer being a transparent conductive material.

8. The organic light emitting diode display device of claim 1, the first conductive layer of the pad being wholly surrounded by the third conductive layer.

* * * * *